United States Patent [19]
Sato et al.

[11] Patent Number: 5,856,208
[45] Date of Patent: Jan. 5, 1999

[54] EPITAXIAL WAFER AND ITS FABRICATION METHOD

[75] Inventors: Tadashige Sato; Megumi Imai; Hitora Takahashi, all of Ushiku, Japan

[73] Assignee: Mitsubishi Chemical Corporation, Tokyo, Japan

[21] Appl. No.: 657,360

[22] Filed: Jun. 3, 1996

[30] Foreign Application Priority Data

Jun. 6, 1995 [JP] Japan ................................ 7-139623

[51] Int. Cl.$^6$ .................................................. H01L 21/20
[52] U.S. Cl. ........................... 438/46; 438/45; 438/505; 438/506; 438/508; 438/569; 257/101
[58] Field of Search ......................... 438/45, 569, 46, 438/505, 506; 436/46, 505; 435/506, 508, 45; 257/101, 102

[56] References Cited

U.S. PATENT DOCUMENTS

| 3,416,047 | 12/1968 | Beale . |
| 3,654,497 | 4/1972 | Dyment . |
| 3,964,940 | 6/1976 | Hart . |
| 4,252,576 | 2/1981 | Hasegawa . |
| 5,057,442 | 10/1991 | Habuka . |
| 5,433,170 | 7/1995 | Toda . |

FOREIGN PATENT DOCUMENTS

| 2094577 | 9/1988 | Japan . |
| 4328823 | 4/1991 | Japan . |
| 4328878 | 4/1991 | Japan . |
| 6268256 | 3/1993 | Japan . |

*Primary Examiner*—Gary Geist
*Assistant Examiner*—Jean F. Vollano
*Attorney, Agent, or Firm*—Armstrong, Westerman, Hattori, McLeland & Naughton

[57] ABSTRACT

The present invention relates to an epitaxial wafer including a PN junction, which is improved in terms of light output and can have a good-enough ohmic electrode formed thereon. Epitaxial layers are formed of $GaAs_{1-x}P_x$ where $0.45 < x \leq 1$). A first P-type layer is formed by a vapor-phase growth process, and a second P-type layer is formed on the first P-type layer by a thermal diffusion process, said second P-type layer having a carrier concentration higher than that of said first P-type layer.

12 Claims, 1 Drawing Sheet

EPITAXIAL WAFER AND ITS FABRICATION METHOD

BACKGROUND OF THE INVENTION

The present invention relates to a semiconductor epitaxial wafer for light emitting diodes or LEDs for short, and its fabrication method.

In recent years compound semiconductors have often been used as optical semiconductor device materials. In semiconductor materials used to this end, epitaxially grown layers of desired semiconductor crystals are formed on single crystal substrates. This is because currently available crystals, especially those usable as substrates have many defects and low purity as well, and so much difficulty is involved in using them immediately for light emitting devices. For this reason, a layer having the composition to obtain the emission of light of desired wavelength is epitaxially grown on a substrate. A ternary crystal layer is used primarily for this epitaxially grown layer. For such epitaxial growth, usually, vapor- and liquid-phase growth processes are employed. In the vapor-phase growth process, a holder made of graphite or quartz is mounted within a reactor made of quartz, in which raw feed gases are continuously fed and heated for epitaxial growth.

Semiconductors of the groups III–V compounds have a bandgap corresponding to the wavelengths of visible light and infrared light, and so are being applied to light-emitting devices. Of these, GaAsP and GaP are widely used as LED materials in particular.

Referring here to $GaAs_{1-x}P_x$ as an example, $GaAs_{1-x}P_x$ where $0.45 < x \leq 1$ is doped with nitrogen (N) as an isoelectronic trap for trapping conduction electrons, so that a light-emitting diode can be obtained, which increases about tenfold in terms of light output. Thus, $GaAs_{1-x}P_x$ where $0.45 < x \leq 1.0$ grown on a GaP substrate is usually doped with nitrogen.

FIG. 2 illustrates one construction of a conventional GaAsP epitaxial wafer.

In the vapor-phase growth process, raw feed gases are continuously fed in a reactor for growing an N-type epitaxial layer on an N-type GaP substrate 1. To prevent the occurrence of lattice strains due to a difference in lattice constant between the substrate and the epitaxial layer, a GaAsP-type layer 2 having a stepwise or continuous varying composition is formed as an intermediate layer to form GaAsP-type layers 3 and 4, each having a constant composition, and the layer 4 is doped with nitrogen, or N, in the form of an isoelectronic trap. At a post-doping step, zinc is thermally diffused at high concentration in the layer 4 to form a P-type layer 5 of about 4 to 10 μm on the surface of the epitaxial layer. Thus, the formed P-type layer has a relatively constant carrier concentration, and good-enough ohmic contact is achievable in a stable manner. The thermal diffusion process enables about dozens of epitaxial wafers to about one hundred to be processed at one time, and offers a cost advantage. Generally, therefore, P-type layers are formed by the thermal diffusion process after N-type layers alone have been grown by the vapor-phase growth process.

By doing this it may be possible to obtain LEDs in a stable manner. However, the carrier concentration of the P-type layer 5 above the PN junction region becomes too high with an increased absorption of light, resulting in a drop of LED light output. In addition, the PN junction region is thermally damaged to incur deterioration of the crystals forming the epitaxial layer. Although these problems may be solved by decreasing the diffusion temperature extremely, yet the P-type layer becomes too thin to obtain good-enough ohmic contact due to a lowering of the surface carrier concentration.

As mentioned above, the vapor-phase grown epitaxial wafer has both the epitaxial layer and the GaP substrate of the N-conduction type. In the epitaxial growth of GaAsP, generally, zinc may be used as a dopant to grow a P-type layer during vapor-phase growth. If doping is carried out with vapor-phase growth using a P-type dopant zinc in the form of diethylzinc gas, the possible highest concentration is about $5 \times 10^{18}$ cm$^{-3}$ due to a high growth temperature when the most prevalent hydride transport process is used; in other words, it is difficult to carry out doping at a concentration higher than that. Nonetheless, since the carrier concentration of the P-type layer in the vicinity of the PN junction is lower than that, the absorption of light by the P-type layer is reduced and the PN junction is formed by vapor-phase growth at one time, so that good-enough crystallinity can be imparted thereto. In addition, the thus obtained P-type layer accomplishes an about 20 to 30% improvement in terms of light output as compared with that formed by thermal diffusion. It is here to be noted that even though growth conditions are adjusted to achieve a high concentration of zinc doping for vapor-phase growth, the crystallinity of the epitaxial layer will become worse.

To form an electrode of good-enough ohmic contact on a P-type layer with semiconductors of the groups III–V compounds, it is usually required that the carrier concentration of the P-type layer be at least $1 \times 10^{19}$ cm$^{-3}$. To obtain good-enough ohmic contact, various procedures have heretofore been used; for instance, various combinations of AuZn, AuNiZn and other materials are selected as electrode materials, or electrodes of multilayered structures or varying compositions are used. Still, the most effective procedure is to increase the carrier concentration of the P-type layer. For example, GaAs has been doped with zinc at a concentration higher than $5 \times 10^{18}$ cm$^{-3}$. When the doping amount of zinc, i.e., the carrier concentration is increased by elevating the diffusion temperature of zinc, however, the P-type layer rather absorbs the emitted light, and crystal defects due to thermal strains or the like occur, resulting in a drop of LED's light-emission output. The light output of an LED may be improved by decreasing the concentration of zinc to about $5 \times 10^{18}$ cm$^{-3}$ or less by lowering the diffusion temperature of zinc. However, the carrier concentration drops, thus making it difficult to form an ohmic electrode on the P-type layer and, hence, giving rise to a forward voltage variation or increase.

According to the present invention accomplished with such situations in mind, it has now been found that in an epitaxial wafer including a PN junction there is a difference in the optimum carrier concentration between a PN junction region and an ohmic contact region in a P-type layer. Thus, an object of the present invention is to provide a P-type layer of the optimum structure that makes it possible to achieve an improvement in light output and form a good-enough ohmic electrode, and a fabrication method effective for such an epitaxial wafer as well.

As a result of intensive studies made for the purpose of solving such a problem, it has now been found that a P-type layer should comprise two layers and that the carrier concentration that is the greatest factor in determining the characteristics of an LED should be optimized, whereby good-enough ohmic contact can be achieved in a stable manner and the light output of an LED can be 20 to 30% higher than achieved so far in the art as well.

SUMMARY OF THE INVENTION

According to one aspect of the present invention, there is provided an epitaxial wafer comprising N-type and P-type epitaxial layers forming a PN junction, wherein the epitaxial layers are formed of $GaAs_{1-x}P_x$ where $0.45<x\leq1$, the P-type epitaxial layers are consisting essentially of a first P-type layer forming one side of the PN junction and having a carrier concentration of 0.5 to $5\times10^{18}$ cm$^{-3}$ and a second P-type layer forming a surface of the epitaxial layers and having a carrier concentration of at least $5\times10^{18}$ cm$^{-3}$.

Preferably, the P-type layer has a carrier concentration of 0.5 to $5\times10^{18}$ cm$^{-3}$ for the first P-type lamina, and at least $5\times10^{18}$ cm$^{-3}$ for the second P-type layers;

the first and second P-type laminae are adjacent to each other; and the first and second P-type layers are in contact with the PN junction and the surface of the epitaxial layer, respectively.

According to another aspect of the present invention, there is provided a method of fabricating an epitaxial wafer comprising N-type and P-type epitaxial layers forming a PN junction by growing a first P-type layer by a vapor-phase growth process, and then forming a second P-type layer on the first P-type layer by a thermal diffusion process, said second P-type layer being higher in carrier concentration than said first P-type layer.

BRIEF DESCRIPTION OF THE DRAWINGS

For the purpose of illustration alone, the present invention will now be explained in detail with reference to the accompanying drawings, in which.

DETAILED EXPLANATION OF THE PREFERRED EMBODIMENTS

Figure 1:
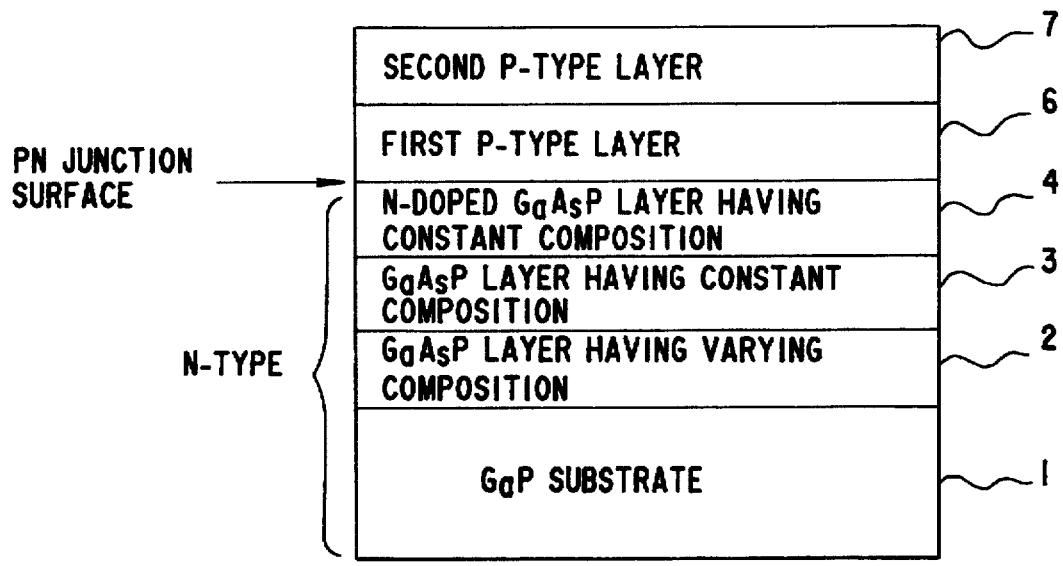
FIG. 1 is a schematic illustrating one construction of the epitaxial wafer according to the present invention.
Figure 2:
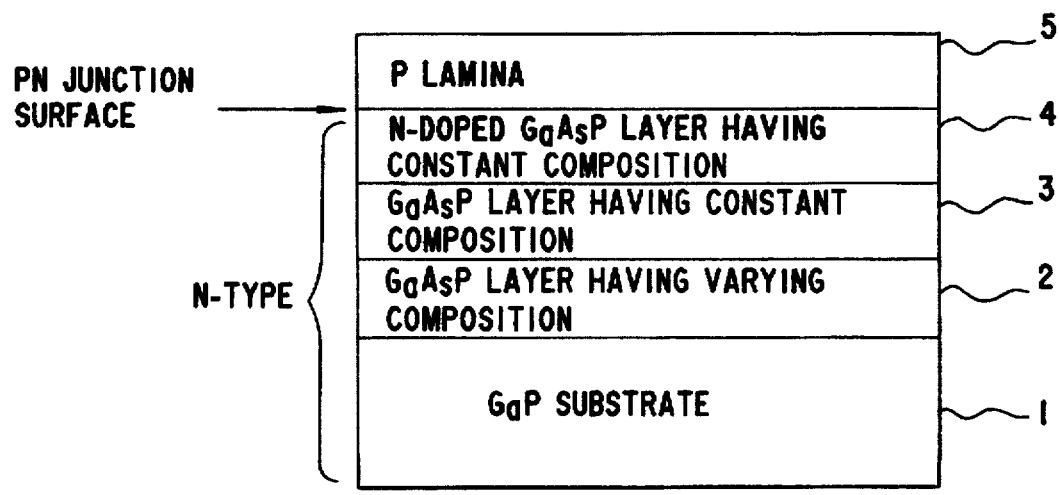
FIG. 2 is a schematic illustrating one construction of a conventional epitaxial wafer.

Referring to FIG. 1, a GaP substrate 1, a layer 2 having a varying composition, and layers 3 and 4 each having a constant composition are the same as illustrated in FIG. 2. Referring generally to $GaAs_{1-x}P_x$ where $0.45<x\leq1.0$ grown on the GaP substrate for LED purposes, an N-type layer that provides a light-emitting layer has a carrier concentration of 0.1 to $2\times10^{16}$ cm$^{-3}$, preferably 0.1 to $0.9\times10^{16}$ cm$^{-3}$, and the constant composition layer 4 is doped with nitrogen as a light-emitting center.

In the specification, a carrier concentration of a layer means an average carrier concentration of the layer.

A first P-type layer 6 is formed by the vapor-phase growth process, and a second P-type layer 7 is formed by thermal diffusion after vapor-phase growth. The first P-type layer 6 just above a PN junction surface has a carrier concentration of preferably 0.5 to $5\times10^{18}$ cm$^{-3}$, most preferably 0.8 to $3\times10^{18}$ cm$^{-3}$. The first and second P-type layers 6 and 7 may be doped with nitrogen, or may partially, or may not, be doped with nitrogen; in any case, the same effect is obtainable.

The second P-type layer that makes ohmic contact has a carrier concentration of at least $5\times10^{18}$ cm$^{-3}$, preferably at least $8\times10^{18}$ cm$^{-3}$, so that the optimum structure for LED purposes can be achieved. Preferable upper limit of carrier concentration is $5\times10^{19}$ cm$^{-3}$ in terms of crystal quality of epitaxial layer. The first and second P-type layers, when their total thickness is smaller than 5 μm, are not suitable for an ordinary LED structure of about 280 μm square because the range of current conduction becomes insufficient. To achieve a wide-enough range of current conduction, it is required that the total thickness of the first and second P-type layers 6 and 7 be at least 8 μm, preferably at least 20 μm. By use of the vapor-phase growth technique it is possible to easily make the P-type layer thicker than achieved by the diffusion technique, i.e., to obtain a layer thickness of at least 20 μm.

The P-type layer structure having two such stepwise carrier concentrations may be achieved by use of the diffusion technique alone, but it is theoretically difficult to obtain a low carrier concentration and a large diffusion layer thickness at the same time. To obtain a layer thickness of especially at least 8 μm, preferably at least 20 μm, it is desired that the first P-type layer 6 having a low carrier concentration be first formed during vapor-phase growth, and the second P-type layer 7 having a high carrier concentration be then formed on the surface of the first P-type layer 6 by diffusion.

The vapor-phase growth technique may effectively be carried out by metallo-organic chemical vapor deposition (MO-CVD), molecular beam epitaxy (MBE), and halogen transport processes among which a hydride transport process is particularly preferable because high-purity crystals can be obtained with high mass productivity. The P-type dopant used herein may be zinc, magnesium or the like, which is preferably fed into a reactor in the form of an organometallic compound such as diethylzinc or $(C_2H_5)_2Zn$, and cyclopentadienylmagnesium or $Cp_2Mg$. If magnesium is used as the dopant, a high carrier concentration can then be so obtained that a structure having a carrier concentration and layer thickness according to the present invention can be achieved by use of vapor-phase growth alone.

According to the present invention, the P-type layer of the epitaxial wafer including a PN junction assumes on a structure having two stepwise carrier concentrations with the layer just above the PN junction, which has a decreased carrier concentration, thereby obtaining high light output, and with the layer just above the first-mentioned layer, which has an increased carrier concentration, thereby achieving good-enough ohmic contact. In addition, since the P-type layer is formed by the vapor-phase growth technique, the PN junction is not thermally damaged during its formation by diffusion. It is thus possible to easily obtain a P-type layer thick-enough to obtain a wide-enough range of current conduction when an LED is fabricated.

The present invention will now be explained more specifically with illustrative and comparative examples.

EXAMPLE & COMPARATIVE EXAMPLE 1

A GaP substrate and high-purity gallium, or Ga, were positioned at given locations within an epitaxial reactor including a Ga reservoir boat made of quartz. Used for this GaP substrate was a GaP substrate to which 3 to $10\times10^{17}$ atoms/cm$^3$ of sulfur (S) were added, and which was in a circular form of 50 mm in diameter and had a plane displaced from the (100) plane at an angle of 6° in the [001] direction. These were placed on a holder rotating at 3 r.p.m. Then, nitrogen, or $N_2$, gas was admitted into the reactor for 15 minutes for the full replacement of the inside air. Following this, high-purity hydrogen, or $H_2$, was introduced in the reactor as a carrier gas at a rate of 9,600 cc per minute, followed by the initiation of heating upon interruption of the flow of $N_2$. After it had been confirmed that the temperatures of the portions at which the Ga-containing boat and GaP single crystal substrate were positioned were kept constant at 800° C. and 930° C., respectively, the vapor-phase growth of a $GaAs_{1-x}P_x$ epitaxial film having a peak light-emitting wavelength of 630±10 nm was initiated.

First, an n-type impurity diethyltellurium, or $(C_2H_5)_2Te$, diluted with hydrogen gas at a concentration of 50 ppm was admitted into the reactor at a rate of 25 cc per minute, while high-purity hydrogen chloride gas, or HCl, was blown into the Ga reservoir boat at a rate of 369 cc/min. to form GaCl at a rate of 369 cc per minute as raw material for the group III element component in the periodic table, and blown out of the surface of the Ga reservoir. On the other hand, hydrogen phosphide, or $PH_3$, diluted with $H_2$ to a concentration of 10% was introduced as the group V element component in the periodic table at a rate of 910 cc per minute, whereby the first or GaP-type layer was grown on the GaP single crystal substrate over a period of 20 minutes.

Then, the amount of hydrogen arsenide, or $AsH_3$, introduced, which was diluted with $H_2$ to a concentration of 10%, was gradually increased from 0 cc per minute to 431 cc per minute while the amounts of the $(C_2H_5)_2Te$, HCl and $PH_3$ gases introduced remained intact. At the same time, the temperature of the GaP substrate was gradually decreased from 930° C. to 870° C., whereby the second $GaAs_{1-x}P_x$ epitaxial layer (having a varying composition where x varies between 0 and approximately 0.65) was grown on the first GaP epitaxial layer over a period of 90 minutes.

While the amounts of $(C_2H_5)_2Te$, HCl, $PH_3$ and $AsH_3$ gases introduced remained intact, i.e., were kept at 15 cc, 369 cc, 910 cc and 431 cc, respectively, the third $GaAs_{1-x}P_x$ layer (having a constant composition where x is approximately 0.65) was grown on the second $GaAs_{1-x}P_x$ epitaxial layer over a period of a further 30 minutes.

While the amount of $(C_2H_5)_2Te$ introduced was decreased at a rate of 1 cc per minute with the amount of HCl, $PH_3$ and $AsH_3$ remained intact, high-purity ammonia gas, or $NH_3$, as a nitrogen isoelectronic trap was added thereto at a rate of 214 cc per minute, the fourth $GaAs_{1-x}P_x$ epitaxial layer (an N-doped layer having a constant composition where x is approximately 0.65) was grown on the third $GaAs_{1-x}P_x$ epitaxial layer over a still further period of 10 minutes.

Over a final period of 40 minutes, $H_2$ gas was introduced at a rate of 50 cc per minute into a $(C_2H_5)_2Zn$-containing cylinder kept constant at 25° C. for the purpose of feeding a P-type dopant gas while the amounts of $(C_2H_5)_2Te$, HCl, $PH_3$, $ASH_3$ and $NH_3$ gases remained intact. Thus, by the introduction of the $(C_2H_5)_2Zn$ vapor-containing $H_2$ gas the fifth $GaAs_{1-x}P_x$ (where x is approximately 0.65) epitaxial layer was grown on the fourth $GaAs_{1-x}P_x$ epitaxial layer for the completion of vapor-phase growth.

The first, second, third, fourth and fifth epitaxial layers were 5 μm, 40 μm, 16 μm, 8 μm and 21 μm in thickness, respectively.

Then, one half of the thus grown epitaxial wafers with nothing coated thereon were sealed under vacuum in a quartz ampoule with a P-type impurity Zn diffusion source in the form of $ZnAs_2$, wherein Zn was diffused from the surface of the epitaxial wafers to a depth of 4 μm at a temperature of 760° C. The carrier concentration of the P-type layers was measured with a semiconductor profile plotter made by Polaron, G. B. The carrier concentration of the P-type layers of another half of the epitaxial wafers was $2 \times 10^{18}$ cm$^{-3}$. The carrier concentration of the P-type layers with Zn diffused in them was $1.2 \times 10^{19}$ cm$^{-3}$ on the surface side and $2 \times 10^{18}$ cm$^{-3}$ on the PN junction side. The fourth layers, with or without Zn diffused in them, were of the same N-type and had a carrier concentration of $8 \times 10^{15}$ cm$^{-3}$. Subsequently, the formation of electrodes by vacuum evaporation and the like were carried out to form prismatic light-emitting diodes of 500 μm×500 μm×180 μm (thickness), which were then measured for luminance at 10 A/cm$^2$ with no epoxy coated thereon. One hundred chips with no diffusion of Zn had a forward voltage varying in the range of 2.3±0.5 V, and a decreased light output of 2,400 Ft·L on an average with a peak wavelength of 632±4 nm because heat was generated from portions of the P-type layers in contact with the electrodes. Fifteen chips with Zn diffused in them, on the other hand, had a forward voltage of 1.8±0.1 V, a light output of 6,100 Ft·L, and a peak wavelength of 631±3 nm.

COMPARATIVE EXAMPLE 2

Vapor-phase growth was completed in the same manner as described in the example with the exception that the above-mentioned fourth layer was grown for 50 minutes with no growth of the fifth layer. The first, second, third and fourth epitaxial layers of the epitaxial film were 5 μm, 39 μm, 15 μm and 27 μm in thickness, respectively.

The carrier concentration of the fourth layer, with a Schottky barrier diode formed on the surface thereof, was $7 \times 10^{16}$ cm$^{-3}$ as measured by the C-V method. Then, the epitaxial wafers with nothing coated thereon were sealed under vacuum in a quartz ampoule with a P-type impurity Zn diffusion source in the form of $ZnAS_2$, wherein Zn was diffused from the surface of the epitaxial wafers to a depth of 4 μm at a temperature of 760° C. to form PN junctions. The carrier concentration of the P-type layers was measured with a semiconductor profile plotter made by Polaron, G. B. The carrier concentration of the P-type layers with Zn diffused in them was $1.5 \times 10^{19}$ cm$^{-3}$ on the surface side. The fourth layers were of the N-type and had a carrier concentration of $8 \times 10^{15}$ cm$^{-3}$. Subsequently, the formation of electrodes by vacuum evaporation and the like were carried out to form prismatic light-emitting diodes of 500 μm×500 μm×180 μm (thickness), which were then measured for luminance at 10 A/cm$^2$ with no epoxy coated thereon. Fifteen chips had a forward voltage of 1.8±0.1 V, a light output of 3,400 Ft·L, and a peak wavelength of 631±3 nm.

According to the present invention as explained above, there can stably be provided an epitaxial wafer which enables LEDs of high light output to be fabricated as display devices. Of importance for LEDs is an improvement in light output because they are used outdoors. According to the present invention it is possible to obtain high light output because the carrier concentration of the PN junction region most important for light output can be controlled. In addition, the carrier concentration of the P-type layer above the PN junction region can be controlled in a stable manner by use of the vapor-phase growth technique, so that it is possible to easily obtain a P-type layer thick-enough to achieve a wide-enough range of current conduction when an LED is fabricated. Further, the use of the vapor-phase growth technique ensures that PN junctions of higher quality and hence higher light output can be obtained, because it is unlikely that the PN junctions are thermally damaged by diffusion during their formation. Furthermore, good-enough ohmic contact can be achieved by allowing the surface layer of the P-type layer to have a high carrier concentration by diffusion. It is to be understood that while zinc is used as the P-type dopant for vapor-phase growth in the instant example, similar effects are obtainable even when zinc or the like is thermally diffused into P-type layers obtained by vapor-phase growth using magnesium.

The entirety of JP-7-139623 filed on Jun. 6, 1995, from which priority under 35 USC 119 is claimed, is incorporated herein by reference.

What we claim is:

1. An epitaxial wafer comprising N-type and P-type epitaxial layers forming a PN junction, wherein the epitaxial layers are formed of $GaAs_{1-x}P_x$ where $0.45<x\leq 1$, the P-type epitaxial layers are consisting essentially of a first P-type layer forming one side of the PN junction and having a carrier concentration of 0.8 to $3\times10^{18}$ cm$^{-3}$ and a second P-type layer forming a surface of the epitaxial layers and having a carrier concentration of at least $5\times10^{18}$ cm$^{-3}$.

2. An epitaxial wafer as recited in claim 1, wherein the epitaxial layers are formed on a substrate of GaP.

3. An epitaxial wafer as recited in claim 1, wherein at least an N-type layer forming the PN junction surface or both said N and P-type layers are doped with nitrogen.

4. An epitaxial wafer as recited in claim 1, wherein the first and second P-type layers have a total thickness of at least 8 μm.

5. An epitaxial wafer as recited in claim 4, wherein the first and second P-type layers have a total thickness of at least 20 μm.

6. An epitaxial wafer as recited in claim 1, wherein a P-type dopant is zinc and/or magnesium.

7. A method of fabricating an epitaxial wafer comprising N-type and P-type epitaxial layers forming a PN junction by growing a first P-type layer by a vapor-phase growth process, and then forming a second P-type layer on the first P-type layer by a thermal diffusion process, said second P-type layer being higher in carrier concentration than said first P-type layer.

8. A method of fabricating an epitaxial wafer as recited in claim 7, wherein said epitaxial wafer comprises N-type and P-type epitaxial layers forming a PN junction, wherein the epitaxial layers are formed of $GaAs_{1-x}P_x$ where $0.45<x\leq 1$, the P-type layers are consisting essentially of a first P-type layer forming one side of the PN junction and having a carrier concentration of 0.5 to $5\times10^{18}$ cm$^{-3}$ and a second P-type layer forming a surface of the epitaxial layers and having a carrier concentration of at least $5\times10^{18}$ cm$^{-3}$.

9. A method of fabricating an epitaxial wafer as recited in claim 8, wherein the growth process is a halogen transport process or a hydride process.

10. A method of fabricating an epitaxial wafer as recited in claim 8, wherein the growth process is a hydride process.

11. A method of fabricating an epitaxial wafer as recited in claim 8, 9, or 10, wherein a P-type dopant gas used for the vapor-phase growth is an organometallic compound of zinc or magnesium.

12. A method of fabricating an epitaxial wafer as recited in claim 8, wherein the first P-type layer has a carrier concentration of 0.8 to $3\times10^{18}$ cm$^{-3}$, and the second P-type layer has a carrier concentration of at least $5\times10^{18}$ cm$^{-3}$.

* * * * *